United States Patent
Serizawa et al.

(10) Patent No.: US 6,388,883 B1
(45) Date of Patent: May 14, 2002

(54) LEAD OUT STRUCTURE FOR LEAD CIRCUIT SECTION OF FLEXIBLE PRINTED CIRCUITRY

(75) Inventors: Yasuyoshi Serizawa; Minoru Kubota, both of Susono (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/617,789

(22) Filed: Jul. 14, 2000

(30) Foreign Application Priority Data

Jul. 29, 1999 (JP) .......................................... 11-215673

(51) Int. Cl.$^7$ ................................................ H05K 5/04
(52) U.S. Cl. ................ 361/752; 361/800; 361/730; 174/254; 200/292; 439/77; 439/67
(58) Field of Search ................................. 361/752, 749, 361/772, 776, 781, 784, 789, 800, 827, 828, 837, 714, 730, 748, 50, 51; 174/254; 439/77, 67, 493, 492–499; 29/840; 200/5 A, 292, 5 E, 5 D, 464

(56) References Cited

U.S. PATENT DOCUMENTS 4,066,851 A * 1/1978 White et al. ................. 200/5 A

FOREIGN PATENT DOCUMENTS

| JP | 9-309390 | * | 9/1997 |
| JP | 9-309390 | | 12/1997 |

* cited by examiner

Primary Examiner—Jayprakash N. Gandhi
Assistant Examiner—Hung Bui
(74) Attorney, Agent, or Firm—Morgan, Lewis & Bockius LLP

(57) ABSTRACT

A pair of bosses are formed in the vicinity of a cut out portion of a lower casing from which a lead circuit section, which is integrally formed with a switch circuit section a flexible printed circuitry is led out. Three engagement holes are arranged in a longitudinal direction of the lead circuit section with predetermined intervals at both end portions of a widthwise direction thereof. The lead circuit section is folded such that all the respective three engagement holes are fitted with the respective bosses while providing surplus length portion in the form of S-shape, and then led out from the cut out portion. The upper casing having a pair of hold-down members are combined with the lower casing such that the hold-down members are engaged with the respective bosses to constitute a casing which serves as a switch unit.

8 Claims, 4 Drawing Sheets

LEAD OUT STRUCTURE FOR LEAD CIRCUIT SECTION OF FLEXIBLE PRINTED CIRCUITRY

BACKGROUND OF THE INVENTION

The present invention relates to a lead out structure for a lead circuit section connected to a flexible printed circuitry housed in a casing of a switch unit.

Door trims for vehicles such as automobiles are normally provided with electrical equipment such as a switch unit including power window switches for use in opening and closing window glasses, door mirror driving switches and so on; and courtesy lamps that are switched off when doors are shut and switched on when opened. In order to connect these kinds of electrical equipment, the door trim is rigged with a number of electric wires and connectors. Such wiring operation is very troublesome because it is carried out blindly through the working window of a door panel. Moreover, many parts for use in electrical mechanism-to mechanism connection are required, which will also result in arduous work of incorporating and connecting them.

In consequence, there has recently been employed a flat circuitry for wiring to complete the connection of electrical equipment (e.g., Japanese Patent Publication No. 9-309390A). A switch holder 1 in a related flat circuitry has been so configured as shown in FIG. 4.

In FIG. 4, the upper-side terminal section 3 of a flexible printed circuitry 2 is bent at a right angle and inserted into and fixed to a switch holder 1. The flexible printed circuitry 2 includes a plastic insulating film 4 and a plurality of parallel printed circuits 5 arranged in the insulating film 4. Further, an engagement hole 6 is bored in four corners of the insulating film 4 and a plurality of contacts 7 following the respective printed circuits 5 are provided in the upper-side terminal section 3 of the flexible printed circuitry 2.

The plastic switch holder 1 comprises a rectangular base plate 8 and a frame-like cover 9 that is pivotal with respect to the base plate 8. The cover 9 is coupled to the base plate 8 by, for example, thin-walled hinges that are integral therewith. A frame wall 10 is uprightly provided to both sides of the base plate 8. Further, an elastic retaining arm 12 and a curved elastic flap 13 with respect to a door trim 11 are projected from the outer wall face of each frame wall 10. In other words, the elastic retaining arm 12 is provided on the rear end portion of each frame wall 10, whereas the elastic flap 13 is provided on the front end portion thereof. Each elastic retaining arm 12 has a retaining projection 14 and a releasing member 15. Moreover, engagement holes 17 with respect to the locking projections 16 provided to the cover 9 are formed in the frame wall 10.

Positioning pins 19 each having conical tilted guide faces 18 relative to the respective retaining holes 6 of the flexible printed circuitry 2 are projected from the base plate 8. Further, an opening 20 is provided in the cover 9, so that the contacts 7 of the flexible printed circuitry 2 and the positioning pins 19 can be located within the opening 20. Incidentally, the tilted guide face 18 may be continuous from the upper to lower ends of the positioning pin 19.

The terminal section 3 of the flexible printed circuitry 2 is positionally mounted on the base plate 8 by mating the engagement holes 6 with the respective positioning pins 19. Then the locking projections 16 are fitted in the respective engagement holes 17 by closing the cover 9, which is locked in such a condition that it clamps the terminal section 3. The positioning pins 19 are so positioned as to project within the opening 20. Due to the positioning pins 19, the contacts 7 are precisely positioned.

FIG. 5 shows a state wherein a flat circuitry 21 has been incorporated in the door trim 11. More specifically, an opening 22 is formed in the door trim 11, and a pair of insertion guides 23 with respect to the switch holder 1 of the flat circuitry 21. are provided in the direction of thickness of the door trim 11. The insertion guides 23 are L-shaped and projected from the upper wall 24 within the opening 22. Moreover, an engagement hole (not shown) is formed in each insertion guide 23 with respect to the retaining projection 14 of the elastic retaining arm 12 of the switch holder 1. The switch holder 1 is supported by the elastic retaining arms 12 and the elastic flaps 13 between the pair of insertion guides 22 so as to be movable in the widthwise direction thereof.

The flexible printed circuitry 2 is made immovable by fitting the positioning pins 19 in the engagement holes 6 respectively provided in the four corners of the insulating film 4 and holding down the flexible printed circuitry. 2 with the cover 9.

The flexible printed circuitry 2 is prepared by printing switching circuits on the film to form an extremely thin contact switch. Although the flexible printed circuitry 2 is immovably fixed by fitting the positioning pins 19 in the respective engagement holes 6 and made immovable by holding it down with the cover 9, the film-like lead circuit section is drawn from the switching circuit section. Consequently, the film-like lead circuit section is strong enough to withstand the tensile force applied in its longitudinal direction. When force is applied in a direction perpendicular to the longitudinal direction of the film-like lead circuit section (in its widthwise direction), however, excessive force as tensile stress is to be applied to one side portion of the circuit section.

When the tensile stress is applied from the outside to the flexible printed circuitry 2 like this, the operating switches may not easily be turned on as the switch contacts become displaced. When further excessive tensile stress is applied from the outside to the flexible printed circuitry 2, the problem is that the disconnection of switching circuits occurs.

SUMMARY OF THE INVENTION

It is therefore an object of the present invention is provide a structure wherein a switching circuitry is formed integrally with a lead circuitry whereby to prevent stress from being applied to the switching circuitry even when tensile stress is applied to the lead circuitry while the lead circuitry is being wired and conveyed, to prevent the switching circuitry from being displaced even when excessive stress acts on the lead circuitry; and to prevent the lead circuitry from being broken even when excessive stress acts on the lead circuitry.

In order to accomplish the object above, according to the present invention, there is provided a structure comprising:

a flexible printed circuitry including a lead circuit section integrally provided with a switch circuit section, and at least one engagement hole is formed on a part of the lead circuit section;

a lower casing having a side wall provided with a cut out portion from which the lead circuit section is led out, and at least one boss formed in the form of S-shape, to which the engagement hole is fitted to mount the flexible printed circuitry thereon; and an upper casing combined with the lower casing to constitute a casing which serves as a switch circuit unit, the upper casing having at least one hold-down member engaged with the boss to hold down the lead circuit section onto the lower casing.

Since the switching circuitry is formed integrally with the lead circuitry whereby it is possible to prevent stress from being applied to the switching circuitry even when tensile stress is applied to the lead circuitry while the lead circuitry is being wired and conveyed; to prevent the switching circuitry from being displaced even when excessive stress acts on the lead circuitry; and to prevent the lead circuitry from being broken even when further excessive stress acts on the lead circuitry.

Preferably, at least three engagement holes are formed on the lead circuit section so as to be arranged in a longitudinal direction thereof with predetermined intervals. The lead circuit section is folded such that all the engagement holes are fitted with the boss to be mounted on the lower casing while providing surplus length portions in the vicinity of the boss, and then led out from the cut out portion.

Preferably, a pair of the at least three engagement holes are formed on the lead circuit section at both end portions in a widthwise direction thereof. A pair of bosses are formed on the lower casing so as to fit with the respective at least three engagement holes. A pair of hold-down members are formed on the upper casing so as to engage with the respective bosses.

Accordingly, even when tensile stress is applied to the lead circuit section while the lead circuit section is being wired or conveyed, such stress can be absorbed by the engagement holes and further stress can be absorbed by the surplus length portion. Therefore, the stress is prevented from being applied to the switching circuit section and even when the excessive stress acts on the lead circuit section, the displacement and breakage of the switching circuit section can be prevented.

Preferably, the hold-down member is a tubular member into which the boss is fitted.

Since the front end of the hold-down member holds down the lead circuit section fitted with the engagement hole, tensile stress applied to the lead circuit section while the lead circuit section is being wired or conveyed can be further surely absorbed. Therefore, the stress is prevented from being applied to the switching circuit section and even when the excessive stress acts on the lead circuit section, the displacement and breakage of the switching circuit section can be prevented.

Preferably, reinforcing dummy patterns are formed on the flexible printed circuitry at both end portions in a widthwise direction thereof.

Since the lead circuit section is formed with reinforcing dummy patterns capable of withstanding tensile stress, the breakage of the lead circuit section, and the displacement of the switching circuit section can be surely prevented.

Preferably, a protective film or a copper foil is formed on the lead circuit section so as to surround the engagement hole.

Since force is applied most strongly to the engagement hole formed in the lead circuit section when the lead circuit section is being wired or conveyed, the provision of the protective films or copper foils on the peripheries of the engagement hole can prevent the breakage of the engagement hole and the displacement of the switching circuit section.

According to the present invention, there is also provided a method comprising the steps of:

preparing a flexible printed circuitry including a lead circuit section integrally provided with a switch circuit section, and at three engagement holes are arranged on a lead circuit section in a longitudinal direction thereof with predetermined intervals;

preparing a lower casing having a side wall provided with a cut out portion from which the lead circuit section is led out, and a boss formed in the vicinity of the cut out portion;

folding the lead circuit section such that all the engagement holes are fitted with the boss while providing surplus length portions in the form of S-shape in order to mount the flexible printed circuitry onto the lower casing;

leading out the lead circuit section from the cut out portion; and combining an upper casing having a hold-down member with the lower casing such that the hold-down member engages with the boss to hold down the lead circuit section onto the lower casing.

DETAILED DESCRIPTION OF THE PREFERRED EMBODIMENTS

A description will now be given of one embodiment of the present invention with reference of the preferred embodiment.

Figure 1:
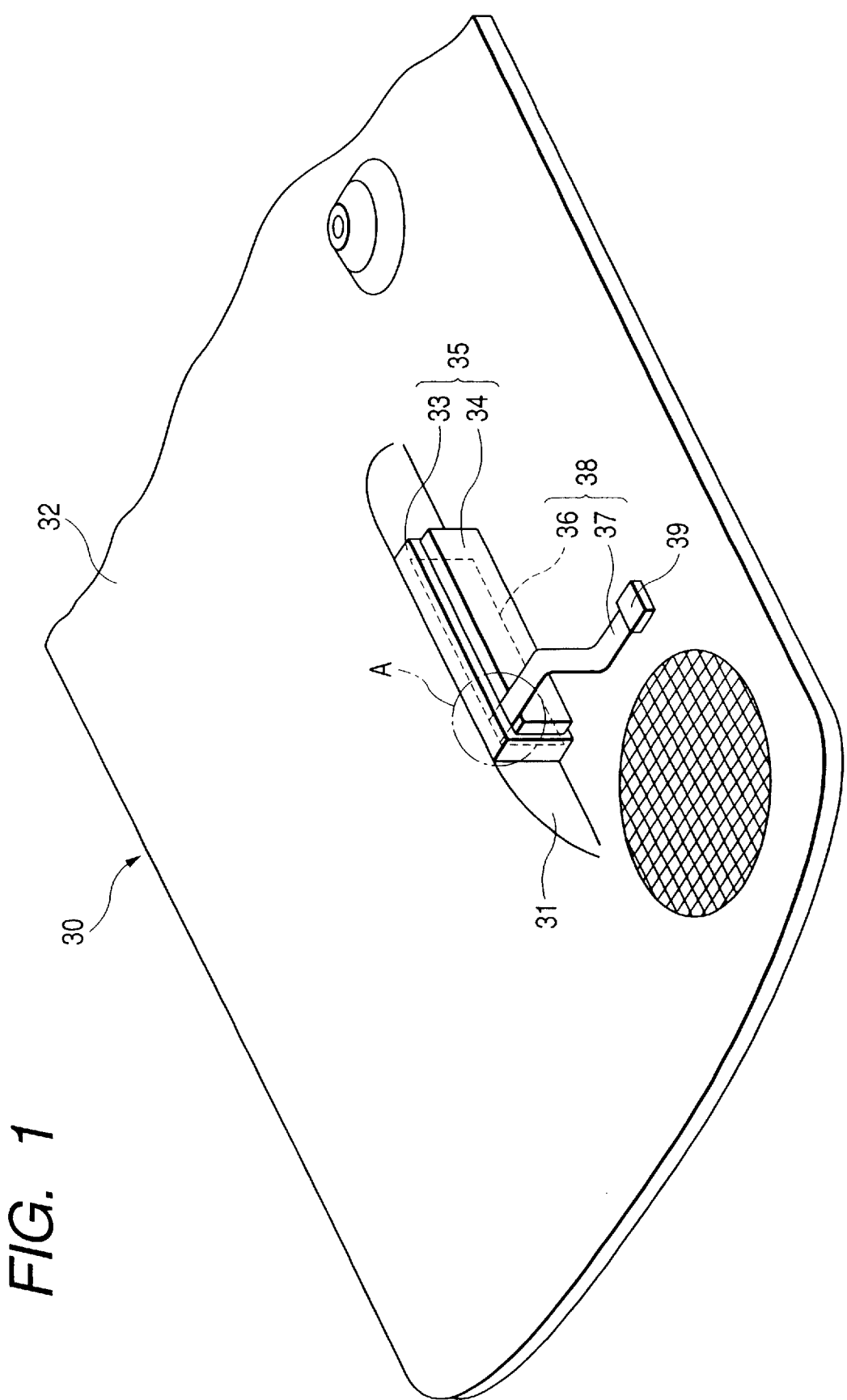
FIG. 1 is an overall perspective view of an application of a lead out structure for a lead wire harness section connected to a flexible printed circuitry housed in a casing of a switch unit, according to one embodiment of the present invention.
Figure 2:
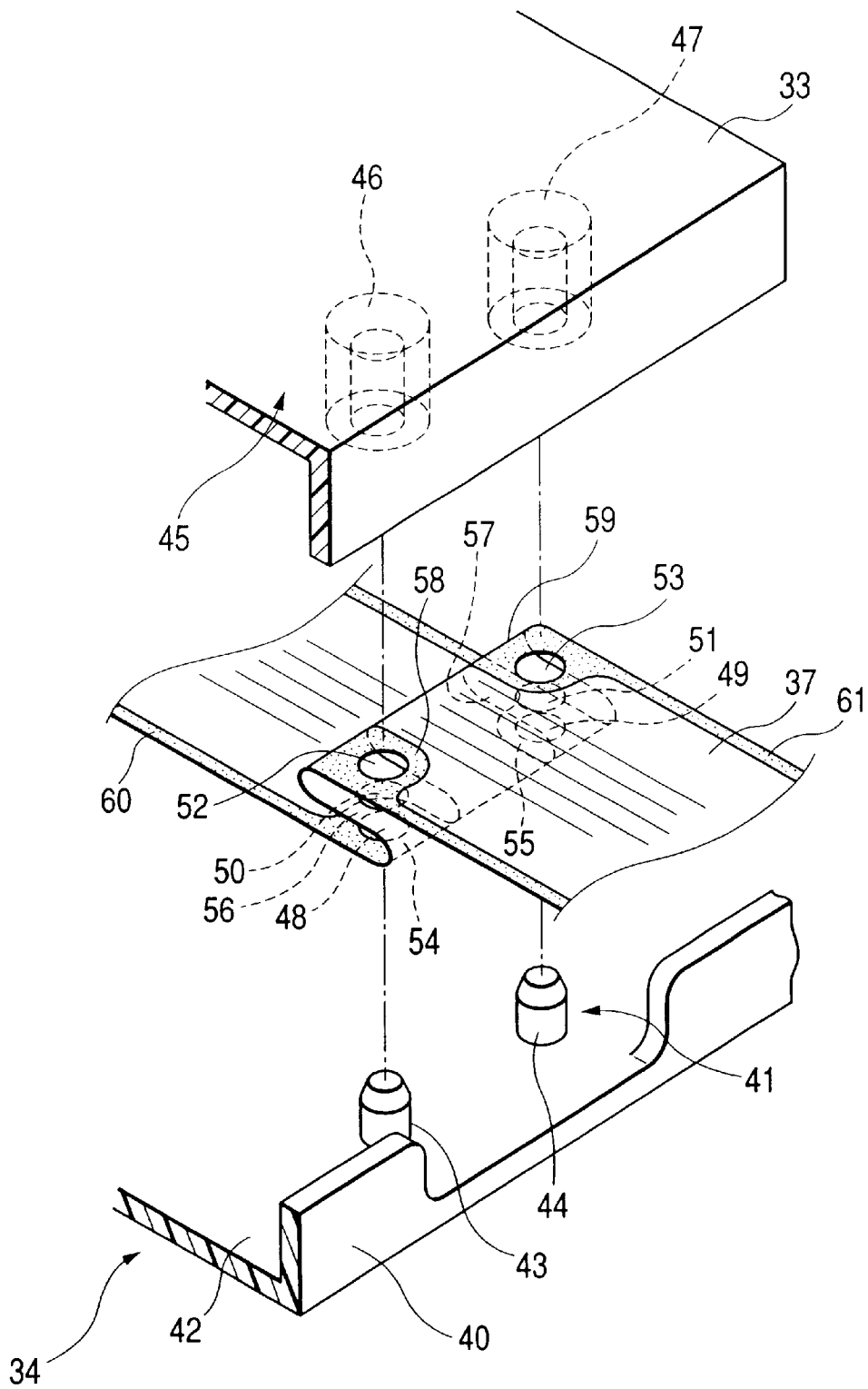
FIG. 2 is an exploded perspective view showing how to assemble the portion A shown in FIG. 1.

FIG. 1 is a perspective view showing a lead out structure for a lead wire harness section connected to a flexible printed circuitry housed in a casing of a switch unit. FIG. 2 is an exploded perspective view showing how to assemble the portion A shown in FIG. 1.

As shown in FIG. 1, an arm rest portion 31 is formed on a door trim 30 in such a manner as to project from the back face 32 of the door trim 30. A plastic upper casing 33 is fitted to the arm rest portion 31, and a lower casing 32 is fitted in the upper casing 33, the upper casing 33 and the lower casing 34 constituting a housing case 35. A switching circuit section 36 is housed in the housing case 35, and a lead wire harness section 37 is connected to the switching circuit section 36. The switching circuit section 36 and the lead wire harness section 37 constitute a flexible printed circuitry 38. The flexible printed circuitry 38 (may be called FPC) is prepared through the steps of printing switching circuits on a flexible film-like plastic material and connecting lead wires to the respective switching circuits by printed wiring in order to form an integrated component. The lead wire harness section 37 of the flexible printed circuitry 38 is led from the housing case 35 outside, a connector 39 being connected to the front end of the lead wire harness section 37. The connector 39 is used to connect the flexible printed circuitry 38 to an external circuitry (ECU).

The portion A of FIG. 1 is configured as shown in FIG. 2. More specifically, a cutout portion 41 for use in taking out the lead wire harness section 37 is formed in the sidewall 40 of the lower casing 34 forming the housing case 35. Bosses 43 and 44 stands upright on the base 42 of the lower casing 34 where the cutout portion 41 is formed.

On the base 45 of the upper casing 33, hold-down members 46 and 47 are provided in opposite positions to the respective bosses 43 and 44 of the lower casing 34. The hold-down members 46 and 47 are cylindrical and the bosses 43 and 44 are fitted in and used to cover the hold-down members 46 and 47 when the upper casing 33 is stacked on the lower casing 34.

On the other hand, pairs of through-holes 48, 49, 50, 41, 52 and 53 are provided in three places of both end portions of the lead wire harness section 37 of the flexible printed circuitry 38 at predetermined intervals in the longitudinal direction.

The through-holes 48 and 49, 50 and 51, and 52 and 53 in pairs are provided in such a manner that the through-holes 48, 50 and 52 are formed at predetermined intervals. Moreover, the through-holes 48, 49, 50, 51, 52 and 53 are formed in places that do not interfere with the printed wiring of the lead wire harness section 37, that is, both side end portions in the widthwise direction of the lead wire harness section 37. Plastic protective films 54, 55, 56, 57, 58 and 59 are affixed to the peripheries of the respective through-holes 48, 49, 50, 51, 52 and 53 in order to prevent the peripheral edges of the through-holes 48, 49, 50, 51, 52 and 53 from being easily damaged when stress is applied to the through-holes 48, 49, 50, 51, 52 and 53 as the lead wire harness section 37 is pulled. The protective films 54, 55, 56, 57, 58 and 59 may be replaced with copper foil.

The three through-holes 48, 50 and 52 formed in one end portion of the lead wire harness section 37 of the flexible printed circuitry 38, and the three through-holes 49, 51 and 53 formed in the other end portion thereof ensure that the lead wire harness section 37 can withstand the stress applied from the outside by means of the three through-holes on one side and the six through-holes on both sides in total by folding the lead wire harness section 37 into an S-shape and fitting the bosses 43 and 44 in the respective layer-to-layer through-holes.

As the switching circuit section 36 is formed integrally with the lead wire harness section 37, force is applied most strongly to the through-holes 48, 49, 50, 51, 52 and 53 formed in the lead wire harness section 37 when the tensile stress is applied to the lead wire harness section 37 while the lead wire harness section 37 is being wired or conveyed. In other words, the provision of the protective films (or copper foils) 54, 55, 56, 57, 58 and 59 on the peripheries of the respective through-holes 48, 49, 50, 51, 52 and 53 can prevent the breakage of the through-holes 48, 49, 50, 51, 52 and 53 because of the damage caused to the peripheries of the through-holes 48, 49, 50, 51, 52 and 53 and also the displacement of the switching circuit section 36, which results in preventing the lead wire harness section 37 from being broken.

In this case, the hold-down members 46 and 47 may be long enough to hold down the lead wire harness section 37 so as to prevent the lead wire harness section 37 from slipping off the bosses 43 and 44 fitted in the through-holes 48, 49, 50, 51, 52 and 53, and may also be long enough to keep holding down the lead wire harness section 37 when the bosses 43 and 44 are fitted therein.

Further, reinforcing dummy patterns 60 and 61 are formed over the whole length of the lead wire harness section 37 of the flexible printed circuitry 38 on both the respective sides of the lead wire harness section 37 of the flexible printed circuitry 38. The reinforcing dummy patterns 60 and 61 are formed simultaneously with patterns for use in forming the lead wires of the lead wire harness section 37. The reinforcing dummy patterns 60 and 61 are used to prevent the lead wire harness section 37 from being broken when the lead wire harness section 37 is pulled for some reason and other and undergoes tensile stress.

Consequently, as the switching circuit section 36 is formed integrally with the lead wire harness section 37, the reinforcing dummy patterns 60 and 61 formed on both the respective sides and in the longitudinal direction of the lead wire harness section 37 prevent the breakage of the lead wire harness section 37 and also the displacement of the switching circuit section 36 even when the tensile stress is applied to the lead wire harness section 37 while the lead wire harness section 37 is being wired or conveyed, which results in preventing the lead wire harness section 37 from being broken.

Figure 3:
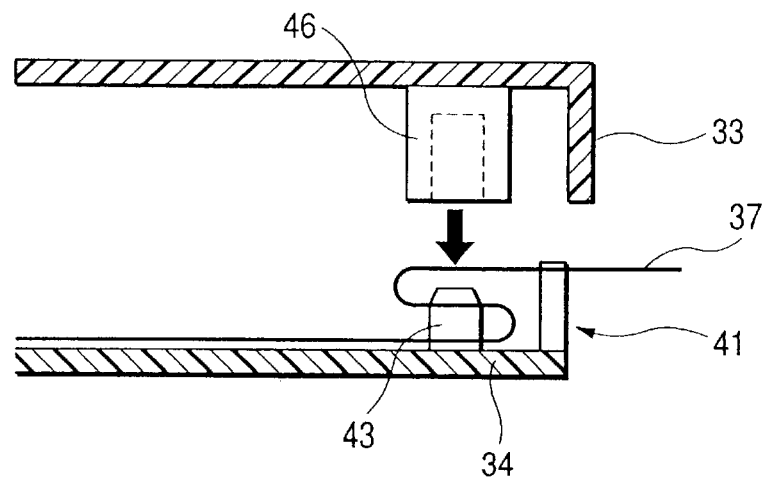
FIG. 3 is a diagram illustrating a procedure for mounting the lead wire harness section of the flexible printed circuitry shown in FIG. 1.
Figure 4:
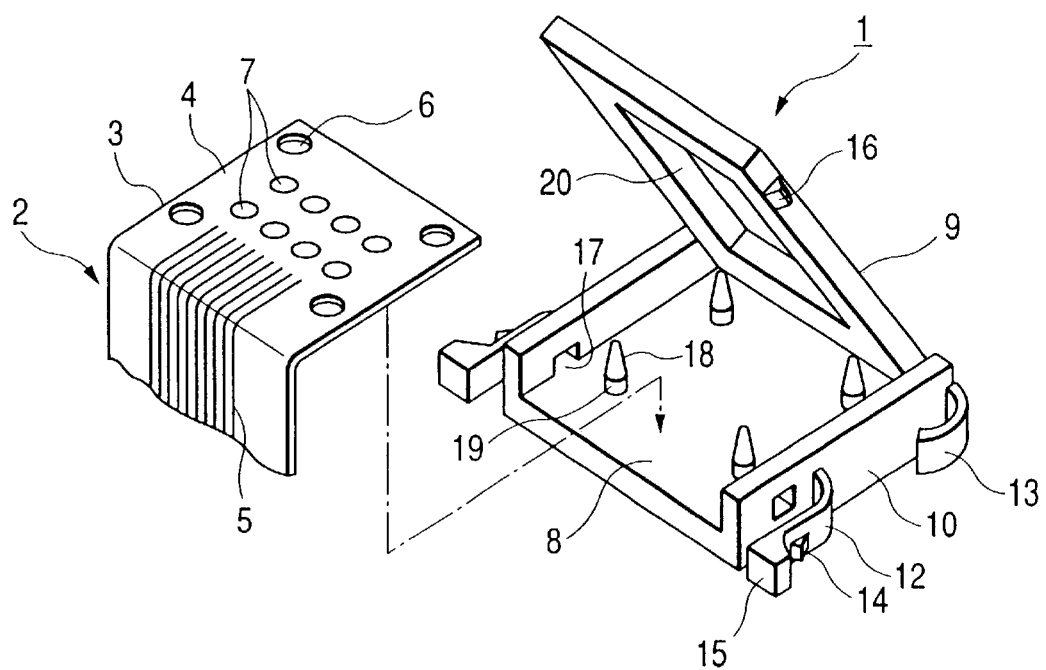
FIG. 4 is an exploded perspective view of a state where a related flexible printed circuitry is assembled in a switch holder.
Figure 5:
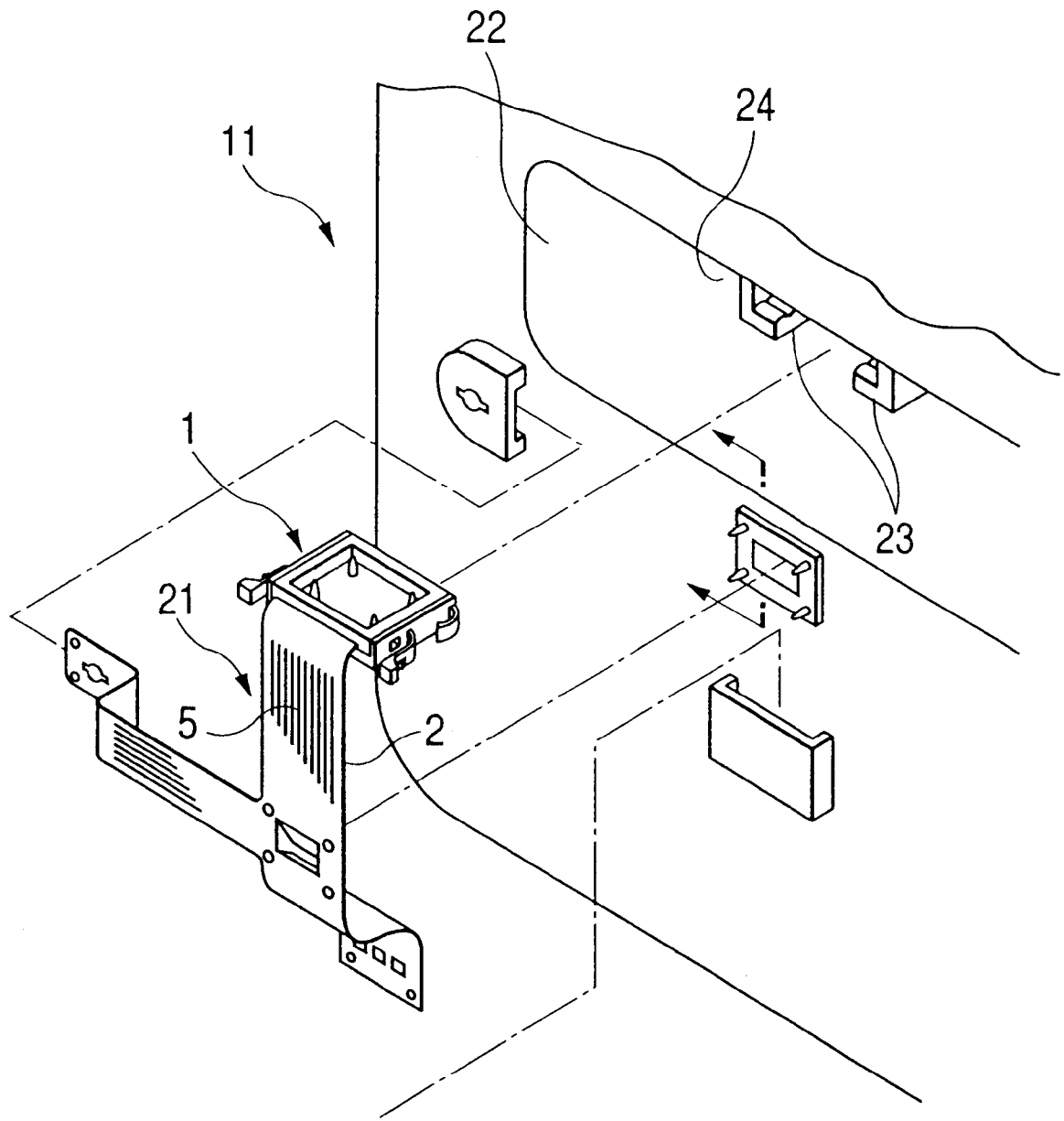
FIG. 5 is an exploded perspective view of a state where flexible printed circuitry shown in FIG. 4. is assembled into a door trim.

As shown in FIG. 3, the lead wire harness section 37 of the flexible printed circuitry 38 is subjected to the following process through the steps of inserting the bosses 43 and 44 of the lower casing 34 into the respective through-holes 48 and 49 of the lead wire harness section 37, folding the lead wire harness section 37 inside out, inserting the bosses 43 and 44 into the respective through-holes 50 and 51 on top of the through-holes 48 and 49, folding the lead wire harness section 37 inside out again, inserting the bosses 43 and 44 into the respective through-holes 52 and 53 on top of the through-holes 50 and 51, and drawing the lead wire harness section 37 outside through the cutout portion 41 of the lower casing 34. Thus, the lead wire harness section 37 provides a surplus length portion formed around the bosses 43 and 44.

When the upper casing 33 is put on the lower casing 34 as shown by an arrow A, the through-holes 48, 49, 50, 51, 52 and 53 with the bosses 42 and 43 fitted therein allow the lead wire harness section 37 of the flexible printed circuitry 38 to provide the surplus length portion within the housing case 35. As the switching circuit section 36 is formed integrally with the lead wire harness section 37, the lead wire harness section 37 contained in the lower casing 34 as the surplus length portion absorbs tensile stress even when the tensile stress is applied to the lead wire harness section 37 while the lead wire harness section 37 is being wired or conveyed, which results in preventing the displacement of the switching circuit section 36 and also the breakage of the lead wire harness section 37.

A lead out structure for the lead wire harness section of the flexible printed circuitry according to the invention is applicable to not solely switching units of automobile doors as described in the above embodiment of the invention but also any structure for leading out a lead wire harness section of a flexible printed circuitry extending from a circuit section (a terminal circuit section etc.) housed in a casing mounted in each portion of an automobile as any electrical equipment.

Although the present invention has been shown and described with reference to specific preferred embodiments, various changes and modifications will be apparent to those skilled in the art from the teachings herein. Such changes and modifications as are obvious are deemed to come within the spirit, scope and contemplation of the invention as defined in the appended claims.

What is claimed is:

1. A structure comprising:
  a flexible printed circuitry including a lead circuit section integrally provided with a switch circuit section, and at least one engagement hole is formed on a part of the lead circuit section;
  a lower casing having a side wall provided with a cut out portion from which the lead circuit section is led out, and at least one boss to which the engagement hole is fitted to mount the flexible printed circuitry thereon; and an upper casing combined with the lower casing to constitute a casing which serves as a switch circuit unit, the upper casing having at least one hold-down member engaged with the boss to hold down the lead circuit section onto the lower casing, wherein at least three engagement holes are formed on the lead circuit section so as to be arranged in a longitudinal direction thereof;

wherein the lead circuit section is folded in an S-shaped form such that all the engagement holes are fitted with the boss to be mounted on the lower casing while providing surplus length portions in the vicinity of the boss, and then led out from the cut out portion.

2. The structure as set forth in claim 1, wherein the engagement holes are arranged in a longitudinal direction thereof with predetermined intervals.

3. The structure as set forth in claim 1, wherein a pair of the at least three engagement holes are formed on the lead circuit section at both end portions in a widthwise direction thereof;

wherein a pair of bosses are formed on the lower casing so as to fit with the respective at least three engagement holes; and wherein a pair of hold down members are formed on the upper casing so as to engage with the respective bosses.

4. The structure as set forth in claim 1, wherein reinforcing dummy patterns are formed on the flexible printed circuitry at both end portions in a widthwise direction thereof.

5. A structure comprising:

a flexible printed circuitry including a lead circuit section integrally provided with a switch circuit section, and at least one engagement hole is formed on a part of the lead circuit section;

a lower casing having a side wall provided with a cut out portion from which the lead circuit section is led out, and at least one boss to which the engagement hole is fitted to mount the flexible printed circuitry thereon; and an upper casing combined with the lower casing to constitute a casing which serves as a switch circuit unit, the upper casing having at least one hold-down member engaged with the boss to hold down the lead circuit section onto the lower casing, wherein the hold-down member is a tubular member into which the boss is fitted.

6. A structure comprising:

a flexible printed circuitry including a lead circuit section integrally provided with a switch circuit section, and at least one engagement hole is formed on a part of the lead circuit section;

a lower casing having a side wall provided with a cut out portion from which the lead circuit section is led out, and at least one boss to which the engagement hole is fitted to mount the flexible printed circuitry thereon; and an upper casing combined with the lower casing to constitute a casing which serves as a switch circuit unit, the upper casing having at least one hold-down member engaged with the boss to hold down the lead circuit section onto the lower casing, wherein a protective film is formed on the lead circuit section so as to surround the engagement hole.

7. A structure comprising:

a flexible printed circuitry including a lead circuit section integrally provided with a switch circuit section, and at least one engagement hole is formed on a part of the lead circuit section;

a lower casing having a side wall provided with a cut out portion from which the lead circuit section is led out, and at least one boss to which the engagement hole is fitted to mount the flexible printed circuitry thereon; and an upper casing combined with the lower casing to constitute a casing which serves as a switch circuit unit, the upper casing having at least one hold-down member engaged with the boss to hold down the lead circuit section onto the lower casing, wherein a copper foil is formed on the lead circuit section so as to surround the engagement hole.

8. A method comprising the steps of:

preparing a flexible printed circuitry including a lead circuit section integrally provided with a switch circuit section, and at three engagement hole are arranged on a lead circuit section in a longitudinal direction thereof with predetermined intervals;

preparing a lower casing having a side wall provided with a cut out portion from which the lead circuit section is led out, and a boss formed in the vicinity of the cut out portion;

folding the lead circuit section in an S-shape form such that all the engagement holes are fitted with the boss while providing surplus length portions in order to mount the flexible printed circuitry onto the lower casing;

leading out the lead circuit section from the cut out portion; and combining an upper casing having a hold-down member with the lower casing such that the hold-down member engages with the boss to hold down the lead circuit section onto the lower casing.

* * * * *